(12) United States Patent
Lalbahadoersing et al.

(10) Patent No.: US 7,598,024 B2
(45) Date of Patent: Oct. 6, 2009

(54) METHOD AND SYSTEM FOR ENHANCED LITHOGRAPHIC ALIGNMENT

(75) Inventors: Sanjaysingh Lalbahadoersing, Helmond (NL); Sami Musa, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 670 days.

(21) Appl. No.: 11/370,159

(22) Filed: Mar. 8, 2006

(65) Prior Publication Data

US 2007/0212652 A1    Sep. 13, 2007

(51) Int. Cl.
  *G03C 5/00*    (2006.01)
(52) U.S. Cl. .................. 430/314; 430/22; 430/313; 430/328; 257/797; 438/401; 438/975
(58) Field of Classification Search .................. 430/22, 430/313, 314, 328; 257/797; 438/401, 975
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |
| 5,969,441 A | 10/1999 | Loopstra et al. |
| 6,046,792 A | 4/2000 | Van Der Werf et al. |
| 2005/0079120 A1 * | 4/2005 | Fujita et al. ................. 423/448 |
| 2007/0212648 A1 * | 9/2007 | Lalbahadoersing et al. . 430/311 |

FOREIGN PATENT DOCUMENTS

| WO | 98/33096 | 7/1998 |
| WO | 98/38597 | 9/1998 |
| WO | 98/40791 | 9/1998 |

OTHER PUBLICATIONS

Seth et al., "Lithographic application of diamond-like carbon films", Thin Solid Films, 254, pp. 92-95 (1995).

* cited by examiner

*Primary Examiner*—Christopher G Young
(74) *Attorney, Agent, or Firm*—Pillsbury Winthrop Shaw Pittman LLP

(57) ABSTRACT

A method for alignment mark preservation includes a step of preparing a lower alignment mark structure on a substrate. In one configuration of the invention, the alignment mark structure includes a lower trench. In a further step, a hard mask coating is applied to a substrate that includes the alignment marks. Preferably, the hard mask material is an amorphous carbon material. In a further step, a selected portion of the hard mask located above the lower alignment mark structure is exposed to a dose of radiation. In one aspect of the invention, the surface of regions of the hard mask coating that receive the dose of radiation become elevated with respect to other regions of the hard mask surface. For those elevated regions of the hard mask that are aligned with an underlying alignment mark trench, the elevated regions serve as an alignment mark that preserves the original horizontal position of the underlying alignment mark.

23 Claims, 10 Drawing Sheets

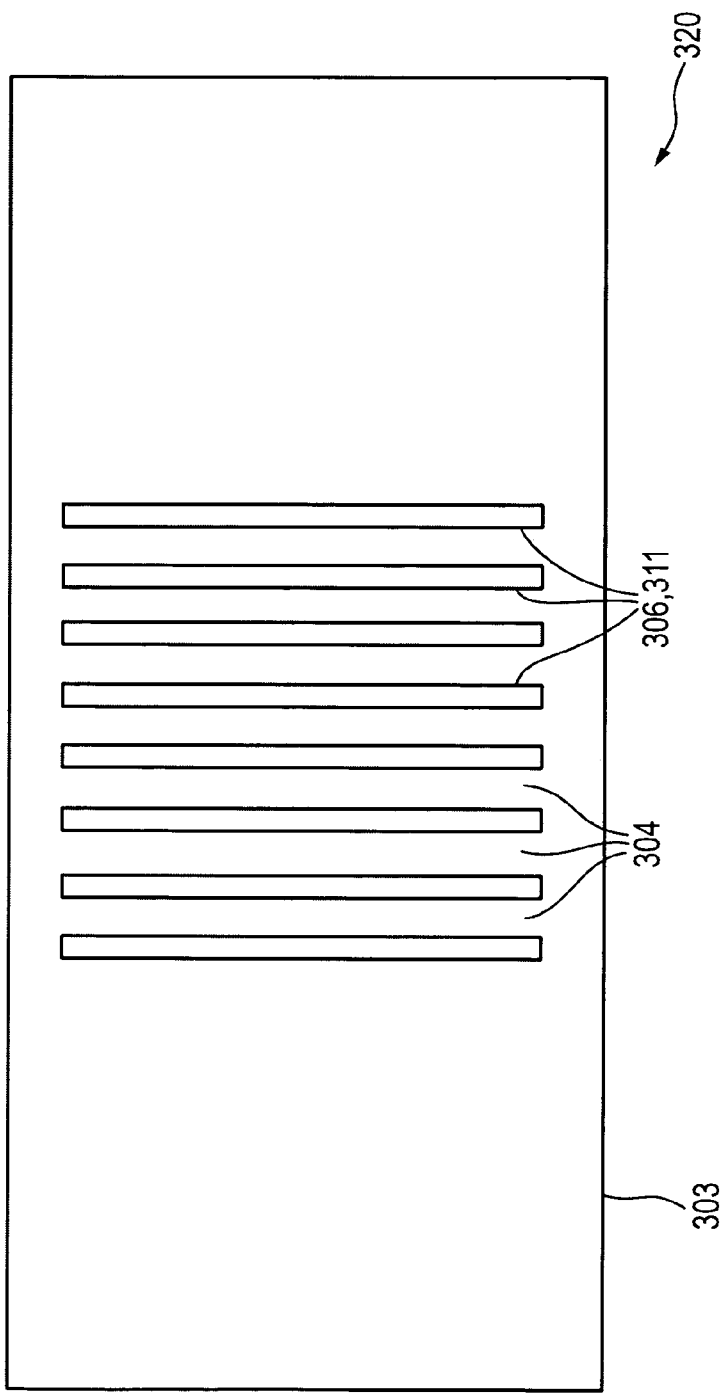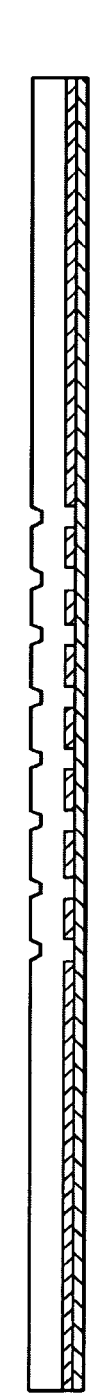
Fig. 3C
Fig. 3B

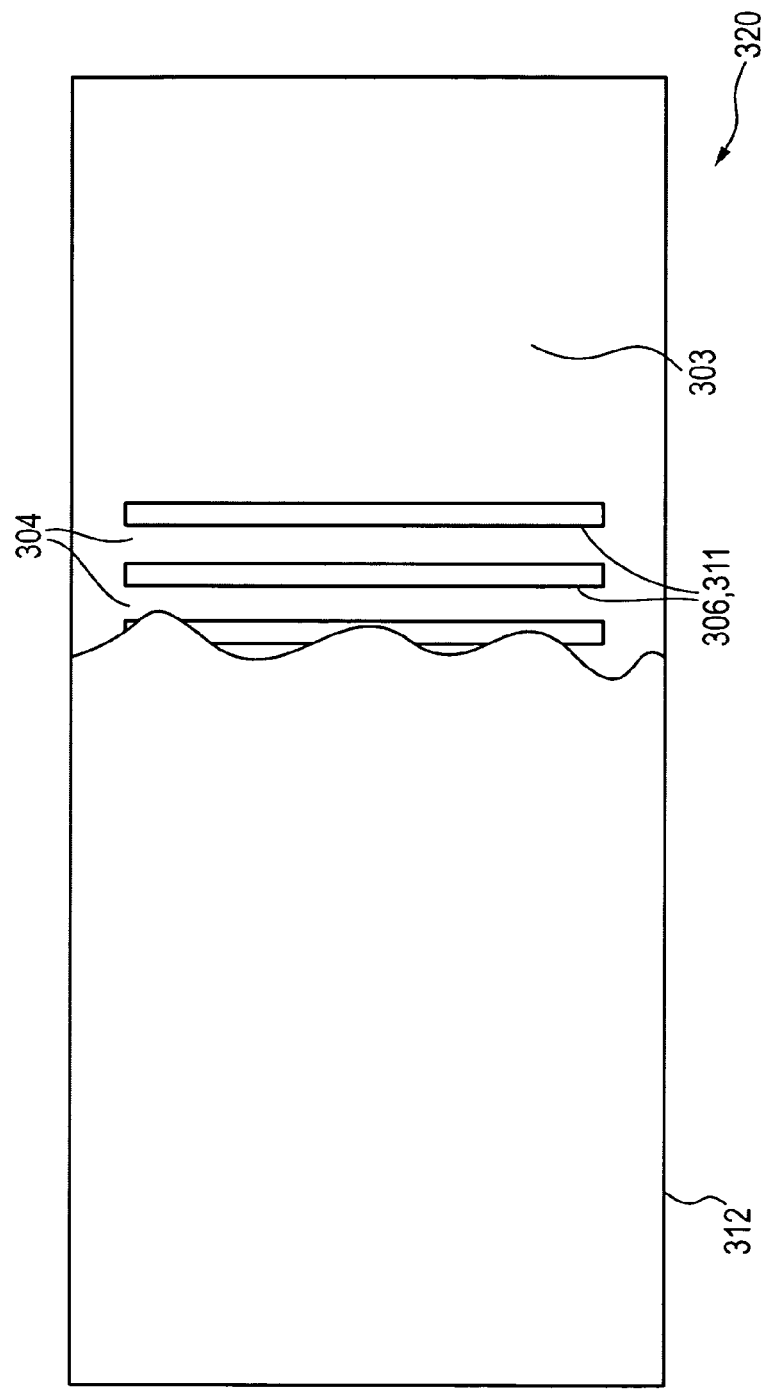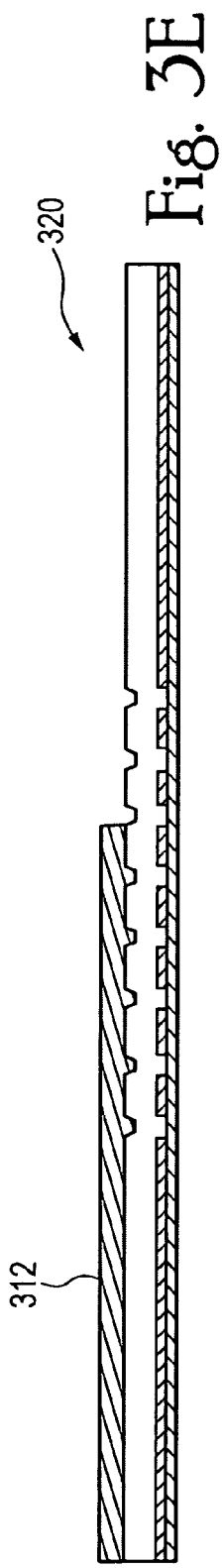

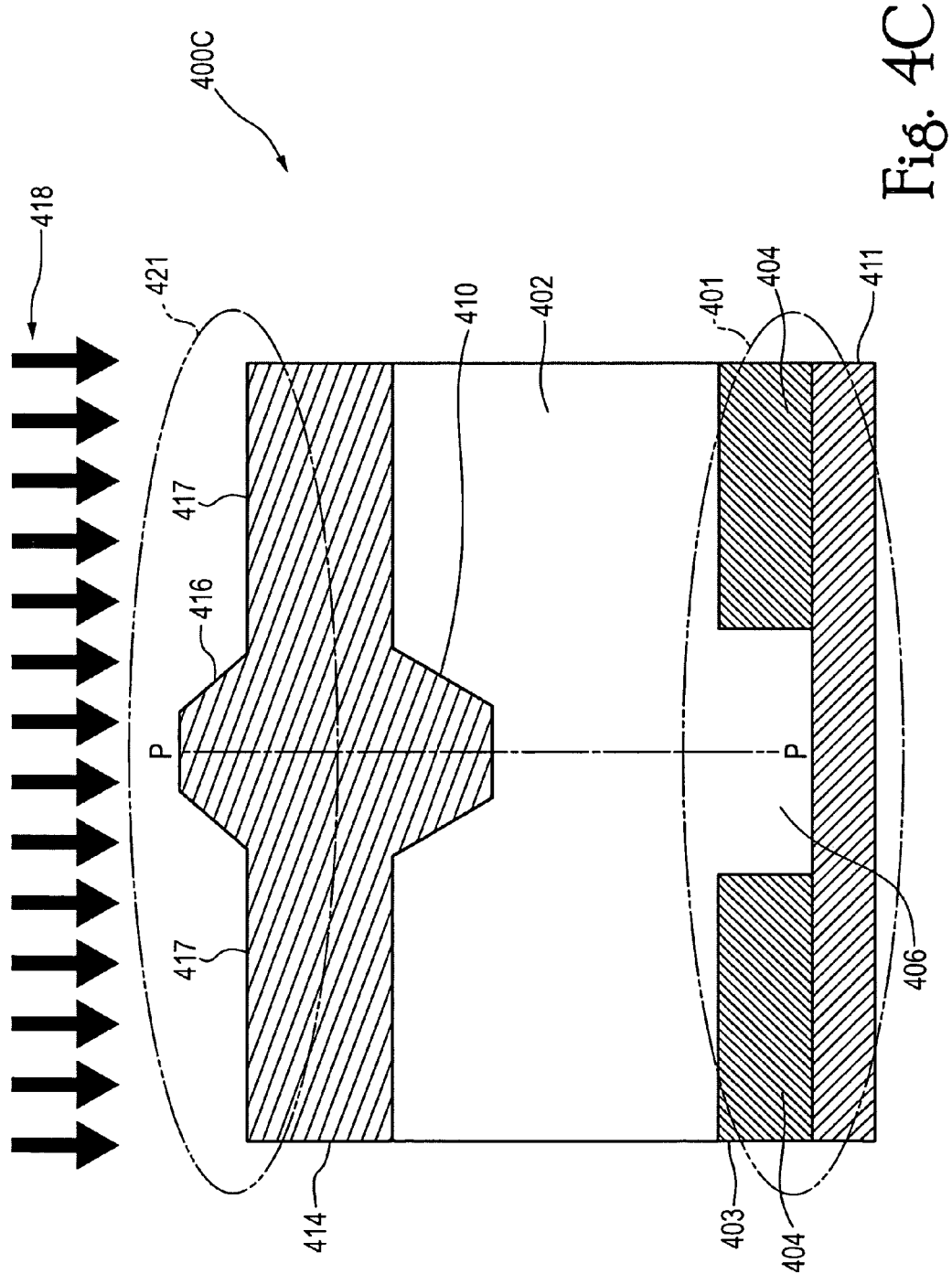

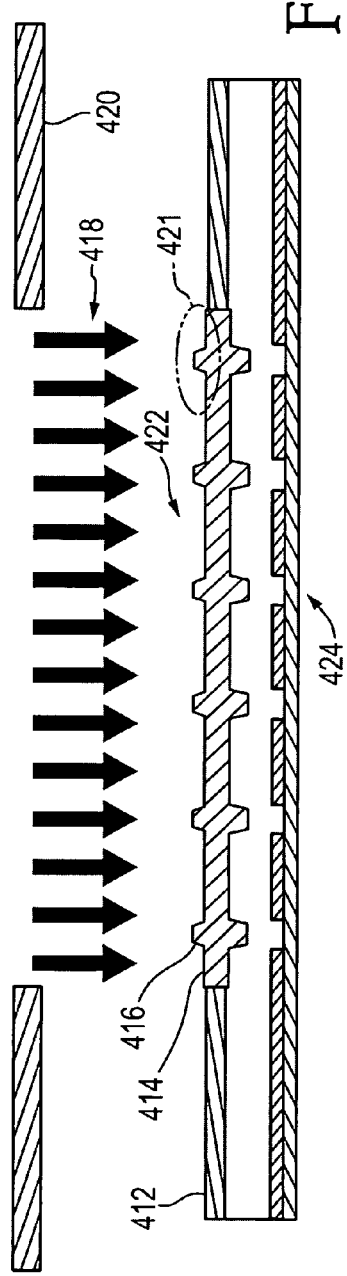
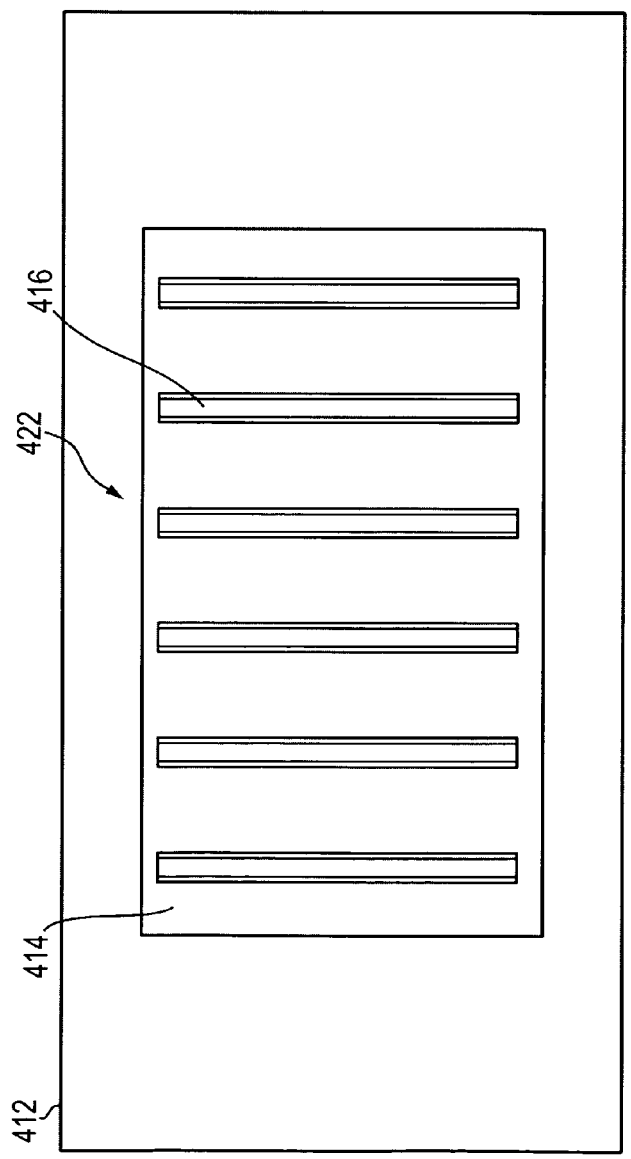
Fig. 4D
Fig. 4E

METHOD AND SYSTEM FOR ENHANCED LITHOGRAPHIC ALIGNMENT

FIELD OF THE INVENTION

The invention relates to a system and method of enhancing alignment in lithographic systems. The invention also relates to use of a hard mask system for improving alignment processes.

BACKGROUND OF THE INVENTION

The invention is directed to the field of lithography and lithographic projection apparatus that encompass a radiation system for supplying a projection beam of radiation, a support structure for supporting a patterning device, which serves to pattern the projection beam according to a desired pattern, a substrate table for holding a substrate; and, a projection system for projecting the patterned beam onto a target portion of the substrate.

The term "patterning device" as employed here should be broadly interpreted as referring to devices that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device. Examples of such patterning devices include:

A mask. The concept of a mask is well known in lithography and it includes mask types such as binary, alternating phase-shift, and attenuated phase-shift, as well as various hybrid mask types. Placement of such a mask in the radiation beam causes selective transmission (in the case of a transmission mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

A programmable mirror array. One example of such a device is a matrix-addressable surface having a visco-elastic control layer and a reflective surface. The basic principle behind such an apparatus is that addressed areas of the reflective surface reflect incident light as diffracted light, for example, whereas unaddressed areas reflect incident light as non-diffracted light. Using an appropriate filter, the non-diffracted light can be filtered out of the reflected beam leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronic circuitry.

In both of the situations described here above, the patterning device can comprise one or more programmable mirror arrays. More information on mirror arrays as here referred to can be gleaned, for example, from U.S. Pat. No. 5,296,891 and U.S. Pat. No. 5,523,193, and PCT patent applications WO 98/38597 and WO 98/33096, which are incorporated herein by reference. In the case of a programmable mirror array, the support structure may be embodied as a frame or table, for example, which may be fixed or movable as required; and A programmable LCD array. An example of such a construction is given in U.S. Pat. No. 5,229,872, which is incorporated herein by reference. As above, the support structure in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as set forth here above.

Lithographic projection apparatus can be used, for example, in the manufacture of integrated circuits (ICs). In that case, the patterning device may generate a circuit pattern corresponding to an individual layer of the IC. This pattern can be imaged onto a target portion (e.g. comprising one or more dies) of a substrate (silicon wafer) that has been coated with a layer of radiation-sensitive material (resist). In general, a single wafer will contain a whole network of adjacent target portions that are successively irradiated via the projection system, one at a time. In current apparatus that employ patterning by a mask on a mask table, a distinction can be made between two different types of machines. In one type of lithographic projection apparatus, each target portion is irradiated by exposing the entire mask pattern onto the target portion in one exposure. Such an apparatus is commonly referred to as a wafer stepper or step-and-repeat apparatus.

In an alternative apparatus, commonly referred to as a step-and-scan apparatus, each target portion is irradiated by progressively scanning the mask pattern under the projection beam in a given reference direction (the "scanning" direction), while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an integrated circuit (IC). Such a patterned layer may then undergo various processes such as etching, ion-implantation (doping), metallization, oxidation, chemical-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens". However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens".

Furthermore, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to the invention in the manufacture of integrated circuits, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The person skilled in the art will appreciate that, in the context of such alternative applications, any use of the terms "reticle", "wafer" or "die" in this text should be considered as being replaced by the more general terms "mask", "substrate" and "target portion", respectively.

In this document, the terms "radiation" and "projection beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), among others.

For lithographic processing, the location of patterns in subsequent layers on the wafer should be as precise as possible for a correct definition of device features on the substrate, which features all should have sizes within specified tolerances. The overlay should be within well-defined tolerances for creating functional devices. To this end, the lithographic projection apparatus comprises an overlay measurement module which provides for determining the overlay of a pattern on the substrate with a mask pattern, as defined in a resist layer on top of the pattern.

The overlay system typically performs the measurement by optical elements. The position of the mask pattern relative to the position of the pattern located on the substrate is determined by measuring an optical response from an optical marker that is illuminated by an optical source. The signal generated by the optical marker is measured by a sensor arrangement. The overlay may be derived from output of the sensors.

Optical markers are used during microelectronic device processing (or IC processing) along the full manufacturing line. During the front end of line (FEOL), markers are used for overlay during manufacturing of transistor structures, for example. At a later stage during the back end of line (BEOL), markers are needed for overlay of metallization structures, e.g. connect lines, and vias. It is noted that in both cases, the integrity of the markers should be sufficient to meet the required accuracy of overlay.

Use of alignment mark in a substrate to promote alignment to a mask requires the ability to image the alignment mark in an imaging device or tool. In fabrication of advanced devices features, it is desirable to use hard mask materials that provide the ability to more easily pattern smaller features into a substrate as opposed to traditional photoresists. However, hard mask layers such as amorphous carbon can prevent or reduce the ability to image alignment marks, thus reducing the usefulness of such hard masks for advanced device patterning.

SUMMARY OF THE INVENTION

In one embodiment of this invention, a method for alignment mark preservation includes a step of preparing a lower alignment mark structure on a substrate. In one configuration of the invention, the alignment mark structure includes a mark trench. In a further step, a hard mask coating is applied to a substrate that includes the alignment marks. Preferably, the hard mask material is an amorphous carbon material. Preferably, the hard mask material coating covers one or more substrate regions containing alignment mark features. In a further step, a selected portion of the hard mask located above the lower alignment mark structure is exposed to a dose of radiation. In one aspect of this invention, the selected portion is determined by providing a mask that selectively passes the radiation onto substrate regions that contain the alignment marks. Preferably, the radiation is visible wavelength radiation or UV radiation, the latter being generated, for example, by an excimer laser source. Preferably, the dose of radiation is sufficient to substantially graphitize the hard mask coating in regions of the substrate that are exposed to the radiation dose. In one aspect of the invention, the surface of regions of the hard mask coating that receive the dose of radiation become elevated with respect to other regions of the hard mask surface. Accordingly, the irradiated hard mask regions retain an elevated topography that can be more easily imaged in an alignment tool, such as an optical alignment system. For those elevated regions of the hard mask that are aligned with an underlying alignment mark structure, the elevated regions can serve as an alignment mark that preserves the original horizontal position of the underlying alignment mark. Accordingly, an alignment that may be partially or completely obscured by a hard mask deposition process, can be subsequently resurrected.

In one embodiment of the present invention, a self-aligned process for preserving an alignment mark structure includes a first step of defining a trench region in a lower alignment mark disposed on a substrate. The trench region may include a plurality of trenches. The lower alignment mark includes a plurality of raised regions that surround and define the trenches in the trench region. In a further step, a coating layer is deposited over the trench region and raised regions of the lower alignment mark. Preferably, the thickness of the coating layer is less than a planarizing thickness, wherein the upper portion of the alignment mark coating layer retains at least one or more upper trench regions, each upper trench region positioned at the same horizontal position as a corresponding lower trench region in the lower alignment mark. A hard mask layer is provided on top of the coating layer. Preferably, the hard mask layer is an amorphous carbon material. In one embodiment, the hard mask layer is substantially planarizing, wherein the thickness of the hard mask layer is locally increased in regions above the trench regions of the lower alignment mark. A portion of the hard mask layer is exposed to a dose of radiation, wherein the dose of radiation is sufficient to substantially graphitize the hard mask layer in exposed regions. Preferably, the exposed portion of the hard mask corresponds to regions of the substrate that include the lower alignment mark. Accordingly, portions of the hard mask exposed to the dose of radiation become elevated with respect to adjacent regions of the hard mask layer, wherein the surface topography of the hard mask in the region of the lower alignment mark is sufficient to be imaged in an imaging device. Preferably, the surface of the hard mask layer is globally elevated with respect to regions outside of alignment mark regions, and also locally elevated in regions corresponding to trench features within the lower alignment mark, wherein the latter features are also imaged.

In one configuration of the present invention, a self-aligned alignment mark structure includes a lower alignment mark region and an upper alignment mark region. The lower alignment mark region includes a lower trench region formed between mesa regions. The alignment mark structure further includes a coating layer disposed over the lower trench and mesa regions of the lower alignment mark region. Preferably, the coating layer is configured to provide on its upper surface an upper trench region whose horizontal position corresponds to that of the lower trench region. In one configuration of the present invention, the upper alignment mark region contains a graphitized amorphous carbon portion. The graphitized amorphous carbon layer portion includes an elevated feature having an upper surface that is raised with respect to adjust surface regions of the amorphous carbon layer portion, and whose horizontal position substantially corresponds to the horizontal position of the lower alignment mark trench region. Preferably, the elevated feature is formed by irradiation of an amorphous carbon precursor hard mask layer disposed on the coating layer, wherein irradiated portions of the hard mask layer are selectively expanded with respect to unirradiated portions of the hard mask. Preferably, the surface topography of the hard mask in the region of the elevated feature of the upper alignment mark is sufficient to be imaged in an imaging device. Preferably, the surface of the hard mask layer is globally elevated with respect to regions outside of alignment mark regions, and also locally elevated in regions corresponding to trench features within the lower alignment mark, wherein the latter features are also imaged.

BRIEF DESCRIPTION OF THE DRAWINGS

Embodiments of the invention will now be described, by way of example only, with reference to the accompanying drawings, as set forth below.

FIGS. 3a-3f illustrate features of a reference alignment mark system used to aid in illustration of principles of the present invention.

FIGS. 4a-e illustrate exemplary features involved in a method and structure for preserving an alignment mark, shown at different stages of processing, in accordance with one configuration of the invention.

DETAILED DESCRIPTION OF THE EMBODIMENTS OF THE INVENTION

Figure 1:
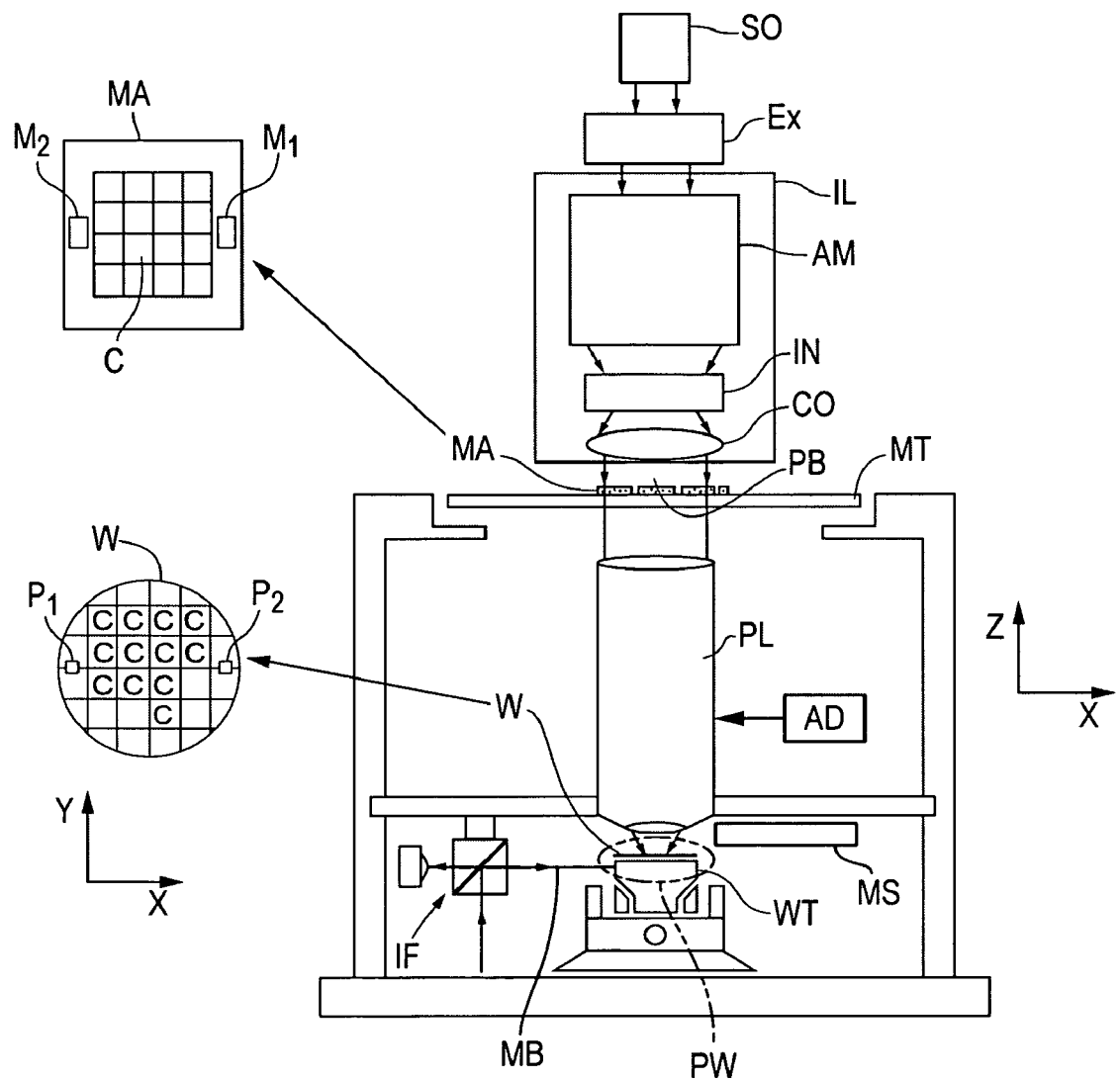
FIG. 1 illustrates a lithographic projection apparatus that includes at least one marker structure.

FIG. 1 schematically depicts lithographic projection apparatus that includes at least one marker structure in accordance with an embodiment of the invention. The apparatus includes:
an illumination system IL for providing a projection beam PB of radiation (e.g. UV or EUV radiation). In this particular case, the radiation system also includes a radiation source SO;
a first support structure MT (e.g. a mask table) for supporting a patterning device, MA (e.g. a mask) and connected to a first positioner (not shown) for accurately positioning the patterning device with respect to item PL;
a second support structure WT (e.g. a wafer table) for holding a substrate, W (e.g. a resist-coated silicon wafer) and connected to a second positioner PW for accurately positioning the substrate with respect to item PL; and
a projection system PL (e.g. a reflective projection lens) for imaging a pattern imported to the projection beam PB by patterning device MA onto a target portion C (e.g. comprising one or more dies) of the substrate W.

The projection system PL is provided with an actuating device AD for adjusting settings of the system. The operation of adjusting settings will be explained hereinafter in more detail.

As depicted here, the apparatus is of a transmissive type (i.e. has a transmissive mask). However the apparatus may alternatively be of a reflective type (with a reflective mask). Alternatively the apparatus may employ another kind of patterning device, such as a programmable mirror array of a type as referred to above.

The source SO (e.g. a mercury lamp or an excimer laser) produces a beam of radiation. This beam is fed into an illumination system (illuminator) IL, either directly or after having traversed conditioning elements, such as a beam expander Ex, for example. The illumination system IL further conditions the beam, and may include adjustable optical elements AM for setting the outer and/or inner radial extent (commonly referred to as σ-outer and σ-inner, respectively) of the intensity distribution of the beam PB. In addition, it will generally include various other components, such as an integrator IN and a condenser CO. In this way, the beam PB impinging on the mask MA includes a desired uniformity and intensity distribution in its cross-section.

It should be noted with regard to FIG. 1 that the source SO may be within the housing of the lithographic projection apparatus (as is often the case when the source SO is a mercury lamp, for example). Alternatively, the source SO may be remote from the lithographic projection apparatus, the beam which it produces being led into the apparatus (e.g. with the aid of suitable directing mirrors). This latter scenario is often the case when the source SO is an excimer laser. The invention is applicable to both of these scenarios.

The beam PB is incident on the mask MA, which is held on the mask table MT. Having traversed the mask MA, the beam PB passes through the lens PL, which focuses the beam PB onto a target portion C of the substrate W. With the aid of the second positioner PW and interferometer IF, the substrate table WT can be moved accurately, e.g. so as to position different target portions C in the path of the beam PB. Similarly, the first positioner (acting on the mask table MT) can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly shown in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:
1. In step mode, the mask table MT and the substrate table WT are kept essentially stationary and an entire pattern imported to the beam PB is projected in one operation (i.e. a single "flash") onto a target portion C. The substrate table WT is then shifted in the X and/or Y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the Y-direction) with a speed v, so that the projection beam PB is caused to scan over a mask image; concurrently, the substrate table WT is simultaneously moved in the same or opposite direction at a speed V=M v, in which M is the magnification of the lens PL (typically, M=¼ or ⅕). In this manner, a relatively large target portion C can be exposed, without having to compromise on resolution.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

In a non-illustrated variant embodiment, the substrate table may be replaced by a twin-scan arrangement that includes two scan stages to which the wafers are supplied successively. While one of the wafers is being exposed in one or other of the different modes described above, another of the wafers is being subjected to the necessary measurements to be carried out prior to exposure, with a view to decreasing the amount of time that each wafer is within the exposure zone and thus increasing the throughput of the system. More generally, the lithographic apparatus may be of a type having two or more substrate tables (and/or two or more mask tables). In such multiple stage machines, the additional tables may be used in parallel or preparatory steps may be carried out on one or more tables while one or more other tables are being used for exposure.

The interferometer typically includes a light source, such as a laser (not shown), and one or more interferometers for determining some information (e.g. position, alignment, etc.) regarding an object to be measured, such as a substrate or a stage. In FIG. 1, a single interferometer IF is schematically depicted by way of example. The light source (laser) produces a metrology beam MB which is routed to the interferometer IF by one or more beam manipulators. In a case where more than one interferometer is provided, the metrology beam may be shared between them, by using optics that split the metrology beam into separate beams for the different interferometers.

A substrate alignment system MS for aligning a substrate on table WT with a mask on mask table MT is schematically shown at an exemplary location close to the table WT, and includes at least one light source which generates a light beam aimed at a marker structure on the substrate W and at least one sensor device that detects an optical signal from that marker structure. It is to be noted that the location of the substrate alignment system MS depends on design conditions that may vary with the actual type of lithographic projection apparatus.

Figure 2:
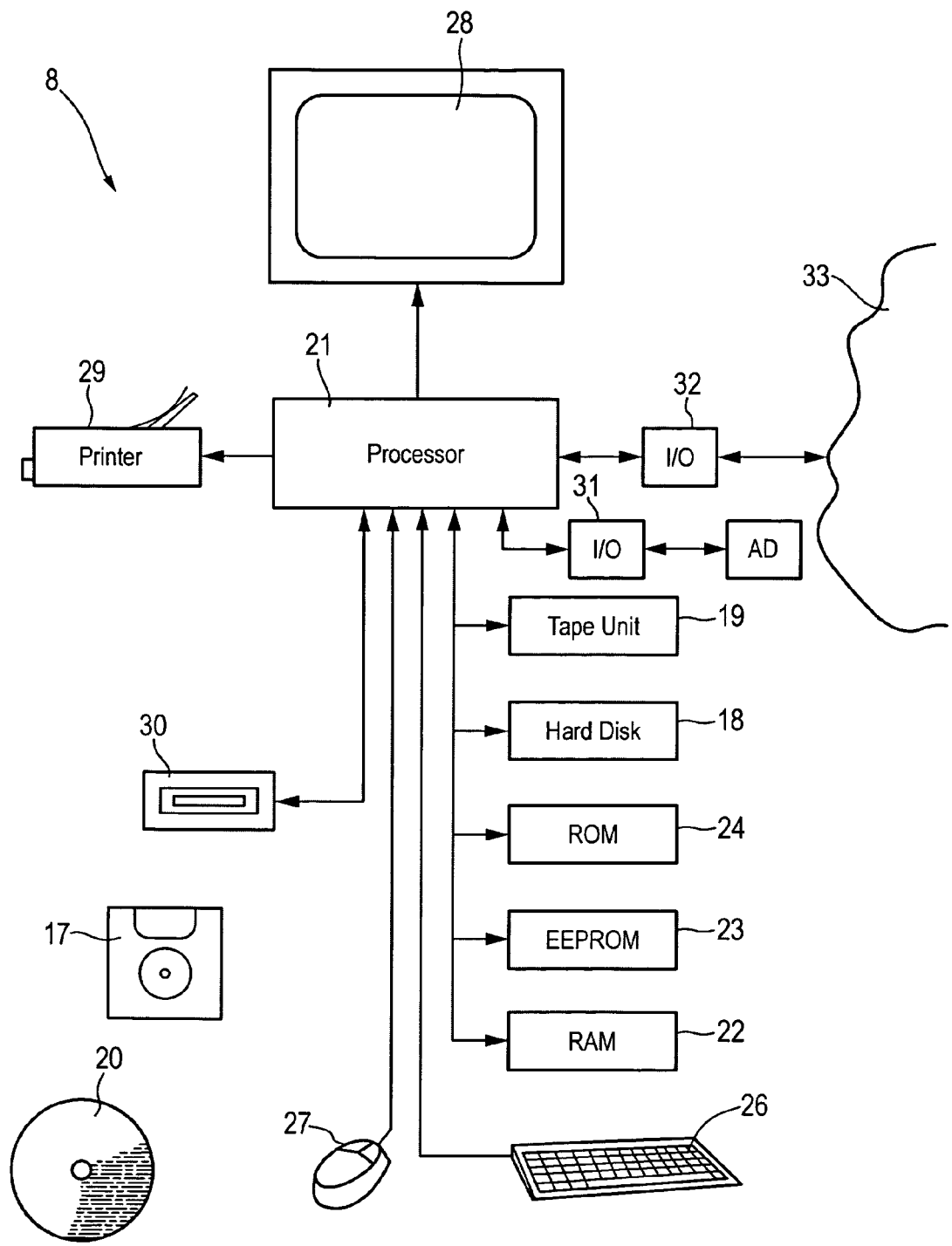
FIG. 2 schematically illustrates a computer arrangement according to one embodiment of the invention.

Furthermore, the lithographic projection apparatus includes an electronic control system that is capable of controlling and adjusting machine setting during execution of an imaging and exposure process. An exemplary electronic control system is schematically illustrated in FIG. 2. It is noted that the lithographic projection apparatus includes sophisticated computing resources for controlling functions of the lithographic projection apparatus with high accuracy. FIG. 2 illustrates only the functionality of the computing resources in relation to the invention. The computing resources may include additional systems and subsystems which are not illustrated here.

Machine setting may be adjusted to compensate for focus offset by displacing the projected image in the vertical (z) direction. Alternatively, machine setting may be adjusted to improve alignment by laterally shifting the image position in the horizontal plane (the x,y-plane).

FIG. 2 schematically illustrates a computer arrangement 8 as used in a particular embodiment of the invention that includes a host processor 21 with peripherals. The host processor 21 is connected to memory units 18, 19, 22, 23, 24 which store instructions and data, one or more reading units 30 (to read, e.g. floppy disks 17, CD ROM's 20, DVD's, etc.), input devices, such as a keyboard 26 and a mouse 27, and output devices, such as a monitor 28 and a printer 29. Other input devices, like a trackball, a touch screen or a scanner, as well as other output devices, may be provided.

An input/output (I/O) device 31 is provided for connection to the lithographic projection apparatus. The I/O device 31 is arranged for handling signals transmitted to and received from actuators and sensors, which take part in controlling projection system PL in accordance with the invention. Further, a network I/O device 32 is provided for a connection to a network 33.

The memory units include a RAM 22, an (E)EPROM 23, a ROM 24, a tape unit 19, and a hard disk 18. However, it should be understood that other memory units may be provided that are known to persons skilled in the art. Moreover, one or more of the memory units may be physically located remote from the processor 21. The processor 21 is shown as one box, however, it may comprise several processing units functioning in parallel or controlled by one main processor, that may be located remotely from one another, as is known to persons skilled in the art.

Furthermore, computer arrangement 8 may be located remotely from the location of the lithographic projection apparatus and may provide functions to the lithographic projection apparatus over a further network connection.

The projection system is provided with an actuating device AD which is capable of adjusting optical settings of the projection system by manipulating the optical elements and stage positions within the projection system. The actuating device AD is provided with input and output ports for exchanging control signals with a control system (not shown). The computer arrangement 8 of the invention is capable of controlling and adjusting the settings of the projection system in such a way that, during an exposure, the overlay displacement of features is made as low as possible. It should be noted that the computer arrangement 8 may receive status signals from the lithographic projection apparatus which relate to the status and/or the settings of the projection system and/or other parts of the lithographic projection apparatus. As will be appreciated by persons skilled in the art, the status signals may influence the timing and/or response of the electronic control system.

Figure 3A:
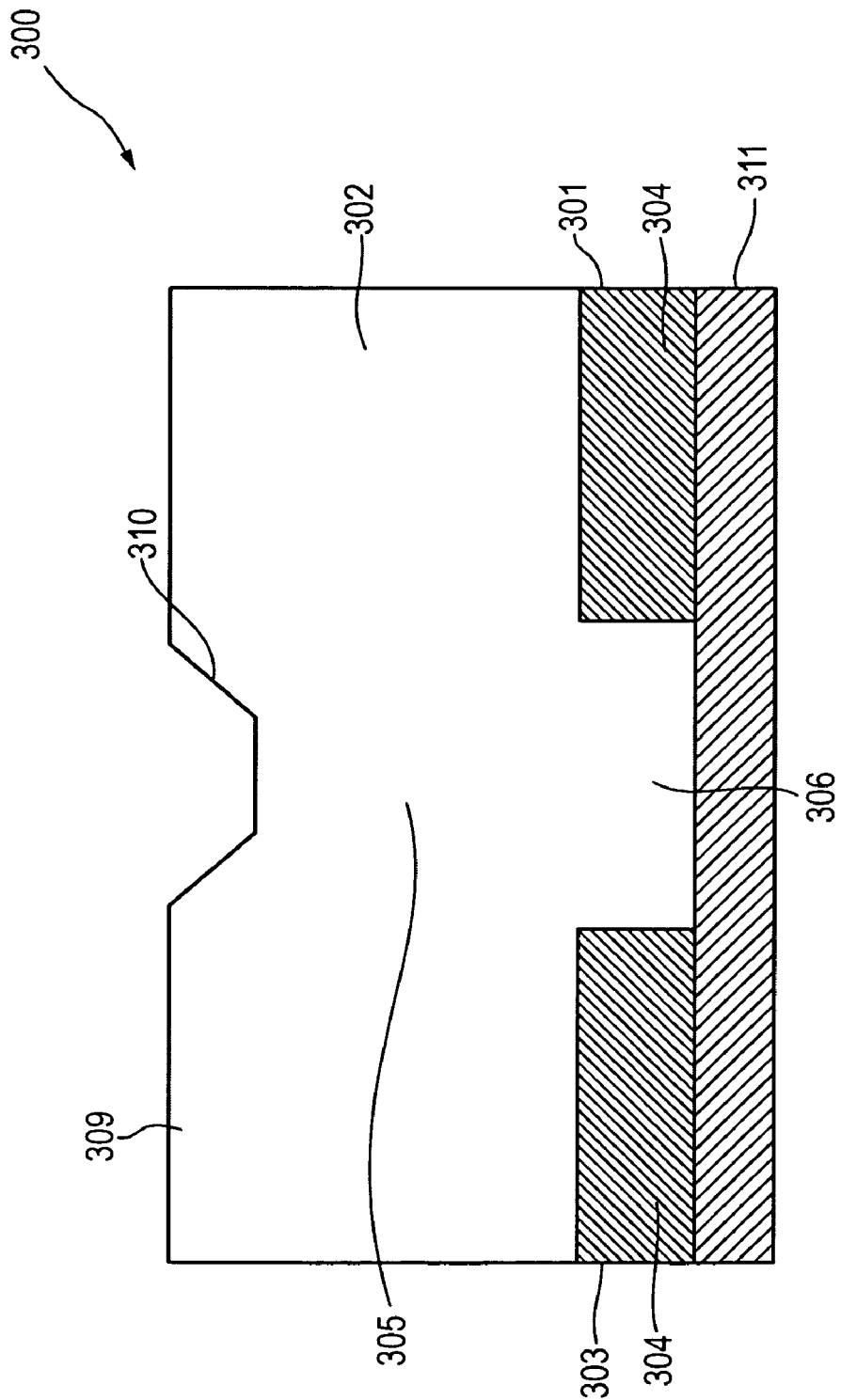

FIGS. 3a-3f illustrate features of a reference alignment mark system used to aid in illustration of principles of the present invention. Stack 300 of FIG. 3a is illustrative of a sequence of layers that can be used in lithographic patterning of a substrate disposed under stack 300. Stack 300 is illustrative, for example, of a portion of a series of layers and structures that cover a substrate, such as a silicon wafer. The lateral and vertical dimensions of the structures shown in FIG. 3*a* can vary from about centimeter size to nanometer size, and preferably have dimensions smaller than about ten micrometers. Stack 300 can represent, for example, a cross-section of a portion of an alignment mark 301 that is disposed on a substrate 311. As illustrated in FIG. 1*a*, alignment mark portion 301 comprises mesa regions 304 and substrate layer 311. Mesa regions 304 can comprise cross-sectional areas of a portion of a linear grating that forms an alignment mark, as illustrated in FIGS. 3*b* and 3*c*. FIGS. 3*b* and 3*c* illustrate respective cross-sectional and top views of an alignment mark 320 that is constructed from a series of alignment mark portions 301 of FIG. 1*a*. Alignment mark 320 can have lateral dimensions, for example, of about 0.001 to 1 millimeter. Accordingly, in the example shown, a single substrate such as a silicon wafer, can many structures corresponding to mark 320, which can be used to perform alignment operations needed to align patterns within a given layer with patterns formed in subsequent layers to be deposited, while mark 320 can include many portions 301 as illustrated in FIG. 3*a*.

Alignment mark portion 301 provides a means to align patterned features formed, for example, within layer 303 with patterned features that are formed in one or more layers subsequently deposited on layer 302. Alignment mark portion 301 includes upper region 305, lower trench region 306, and mesa regions 304. As illustrated, regions 305 and 306 are formed from a common material. During formation of alignment mark 301, a patterning process patterns layer 303 into separate mesa regions 304 in which trench region 306 is created. For example, layer 303 can initially be an unpatterned layer of silicon, metal, silicon oxide, silicon, nitride, and the like. A subsequent layer 302 can be deposited, consisting of a different material from layer 303, by any of known deposition techniques, such as CVD or PVD. Often, layer 302 is substantially optically transparent such that layers underneath layer 302 can be observed in an optical imaging tool. If optical properties of layer 304 are sufficiently different than the optical properties of substrate 311, for example, then trench region 306 will provide optical contrast to mesa regions 304 and can be accordingly imaged in an optical tool. For example, as illustrated in FIG. 3*c*, if layer 302 is substantially transparent to the light used in an optical imaging device or tool, in a plan view, trench regions of mark 301 may appear to have an optical appearance of underlying substrate 311 while mesa regions have optical appearance of layer 303. Accordingly, the contrast between trench region 306 and mesas 304 can be used to provide a reference position with respect to other patterned features arranged on the substrate (not shown) that may be used to form device elements, for example. By providing a reference position in layer 303, the alignment structures can be used to align a subsequent lithographic mask to features in layer 303, for example.

As noted above, in the example illustrated in FIG. 3*a*, in order for alignment to be facilitated, it is desirable that regions 304 be easily imaged with respect to region 306 using, for example an optical tool that shines light upon an upper surface region 309. Thus, it is desirable that light substantially penetrate through layer 302. However, in order for layer 302 to be patterned, sacrificial layers such as resist or hard mask layers are typically deposited on top of layer 302. The latter materials are increasingly desirable as the size of patterned features shrinks in advanced device structures. For example, in deep UV processing of device structures, a device feature size ("critical dimension, or CD) can be smaller than 100 nm. Traditional resist material is not well suited for patterning such small features, leading to the development of many hard mask materials. The term hard mask, as used herein, generally refers to a structure and material used to form the structure, wherein the structure is used to pattern features into regions that lie below the hard mask. A hard mask material is generally more mechanically rigid than photoresist materials, and also more resistant to etching processes that are used to etch the underlying layers. The greater etch resistance and greater rigidity make hard masks suited for patterning smaller features.

Figure 3D:
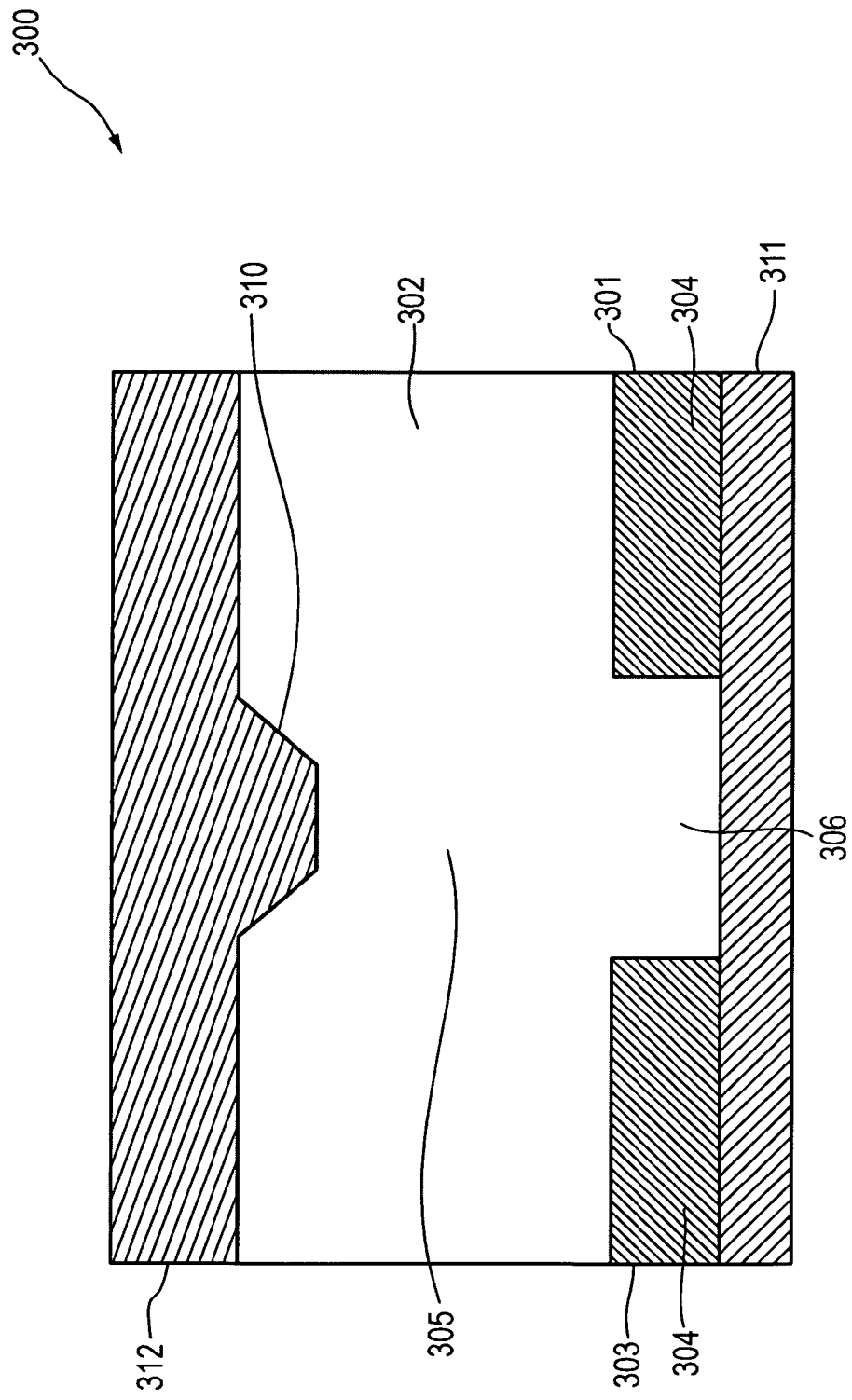

Amorphous carbon has recently emerged as a leading hard mask candidate for patterning very small structures, because of ease of deposition of the carbon, large etch selectivity of amorphous carbon with respect to underlying materials, and ease of removal using plasma ashing. However, hard masks based on amorphous carbon materials typically present problems for alignment to underlying alignment marks. Amorphous carbon layers can be relatively opaque such that underlying alignment marks cannot be easily imaged in a tool used to perform alignment. FIG. 3*d* illustrates a hard mask layer 312 deposited on the stack 300 of FIG. 3*a*. If layer 312 is amorphous carbon, imaging of mark portion 301 may be difficult or impossible, depending on the thickness and opacity of layer 312. Amorphous carbon layers typically are relatively planarizing, wherein underlying topography becomes smoothed out, as illustrated in FIG. 3*d*. Thus, surface 314 appears featureless, as notch region 310 in layer 302 is planarized by film 312. Accordingly, an imaging tool may see neither the trench features 306 of FIG. 3*c* nor any surface features of layer 312, such that the location of alignment mark 320 or portions 301 therein, may be substantially unobservable as shown in FIGS. 3*e* and 3*f*.

FIGS. 4*a-e* illustrate exemplary features of a method and structure for preserving an alignment mark, shown at different stages of processing, in accordance with one configuration of the invention. The alignment mark structure and process illustrated in FIGS. 4*a-e*, can be used, for example, in conjunction with an alignment structure held in mask table MT, to provide alignment of a substrate W with a mask MA.

Figure 4A:
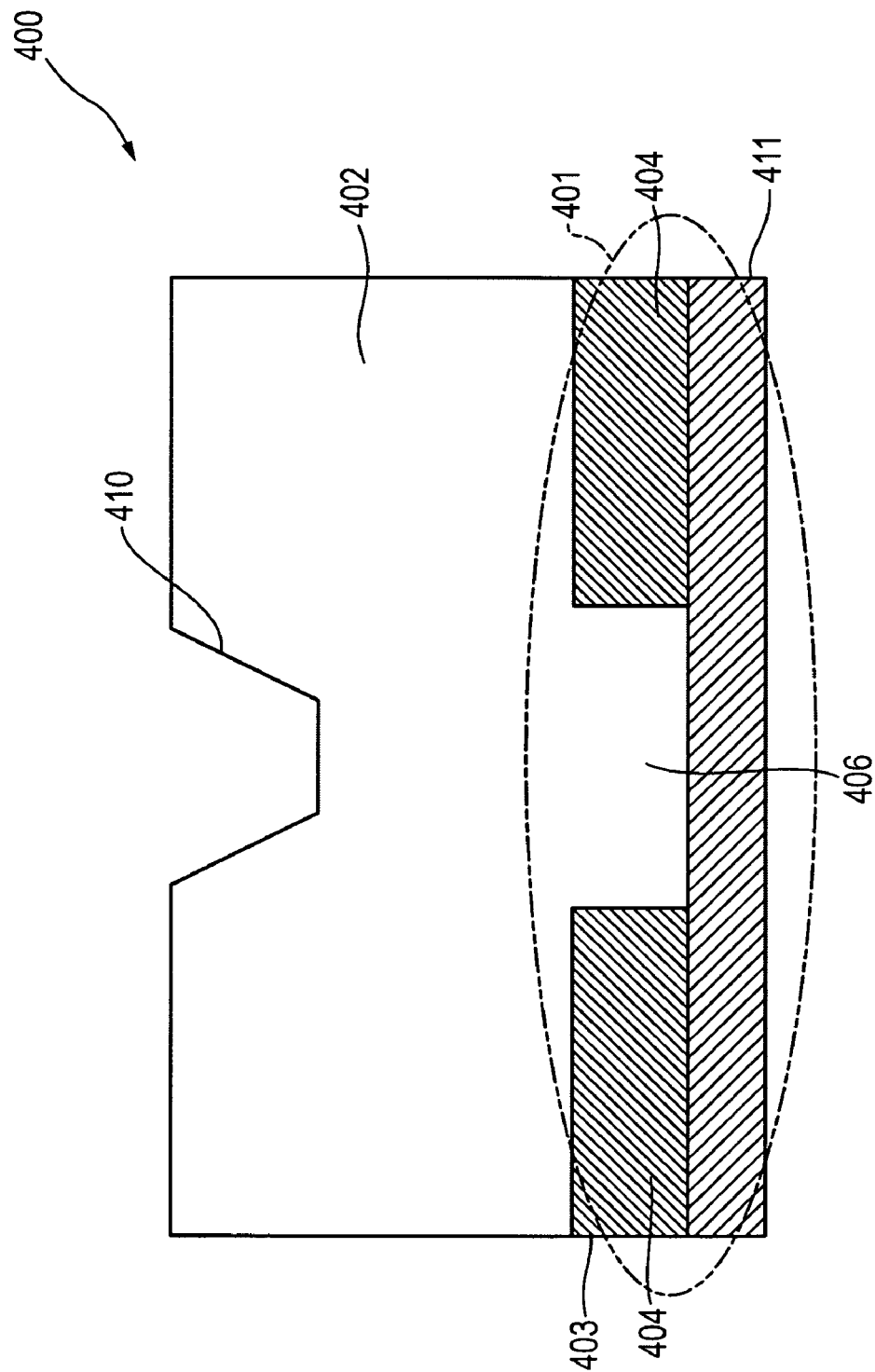

In FIG. 4*a*, stack 400 includes an alignment mark portion 401 provided with trench 406 and mesas 404. Trench region 406 is formed by depositing "mesa" layer 403 on substrate 411 and etching a selected region of mesa layer 403 so as to form mesas 404 that surround trench region 406. Substrate 411 can be a single crystal wafer or any layer deposited on a pre-existing substrate, or a layer deposited on other layers (not shown). Mesa layer 403 could be, for example, a polysilicon layer, and substrate 411 could be an oxide layer. Layer 402 disposed on mesas 404 and substrate 411 in trench regions 406 is preferably formed by a deposition process, such as CVD or PVD. Preferably, layer 402 retains an upper trench region 410 after deposition. The extent to which trench region 410 is preserved depends on such factors as the height of mesas 404, the thickness of layer 402, and the conformality of the deposition process used to deposit layer 402. Thus, for greater thicknesses of layer 402, processes that are at least partially conformal (that is, at least partially non-planarizing) are preferred to preserve the upper trench region 410. For lesser thickness of layer 402, less conformal processes that tend to planarize layer 402 as long as some upper trench feature remains. As in the case of FIGS. 3*a* and 3*b*, stack 400 can include many adjoining alignment mark portions 401 that together comprise an alignment mark. Furthermore, alignment mark portion 401 is an alignment mark structure that can be used singly or repeated to form a larger alignment mark structure within additional alignment marks disposed on substrate 411.

The term "alignment mark structure," as used herein, generally refers to an arrangement of features on a substrate, that can be imaged in order to perform an alignment procedure. The term "alignment mark structure" can refer to a single portion 401 that contains a trench region and a pair of mesas, or can refer to an alignment mark or series of alignment marks that each include many such mesas and trenches. Furthermore, it will be apparent, that within an alignment mark structure, a series of mesas and trenches may be arranged along different directions, for example, mutually orthogonal "X-" and "Y-" directions within a substrate plane. For example, an alignment mark structure can comprise a plurality of "X" and "Y" gratings, where each grating includes a series of linear mesas interspersed with linear trenches. Moreover, the term alignment mark structure can refer to a group of structures that includes features additional to trenches and mesas. For example, the alignment mark structure of FIG. 4a could include an additional layer or layers (not shown) that are deposited on top of mesas 404 and substrate 411. In one particular example, the entire stack 400 could be considered to be an alignment mark structure although it need not be so considered.

Similarly, the term "lower alignment mark structure" refers generally to an alignment mark structure as defined above that is located below an "upper alignment mark structure" as discussed further below. The lower alignment mark structure so defined, need not be used for the purposes of alignment, but can be used for the purposes of producing the upper alignment mark structure.

Figure 4B:
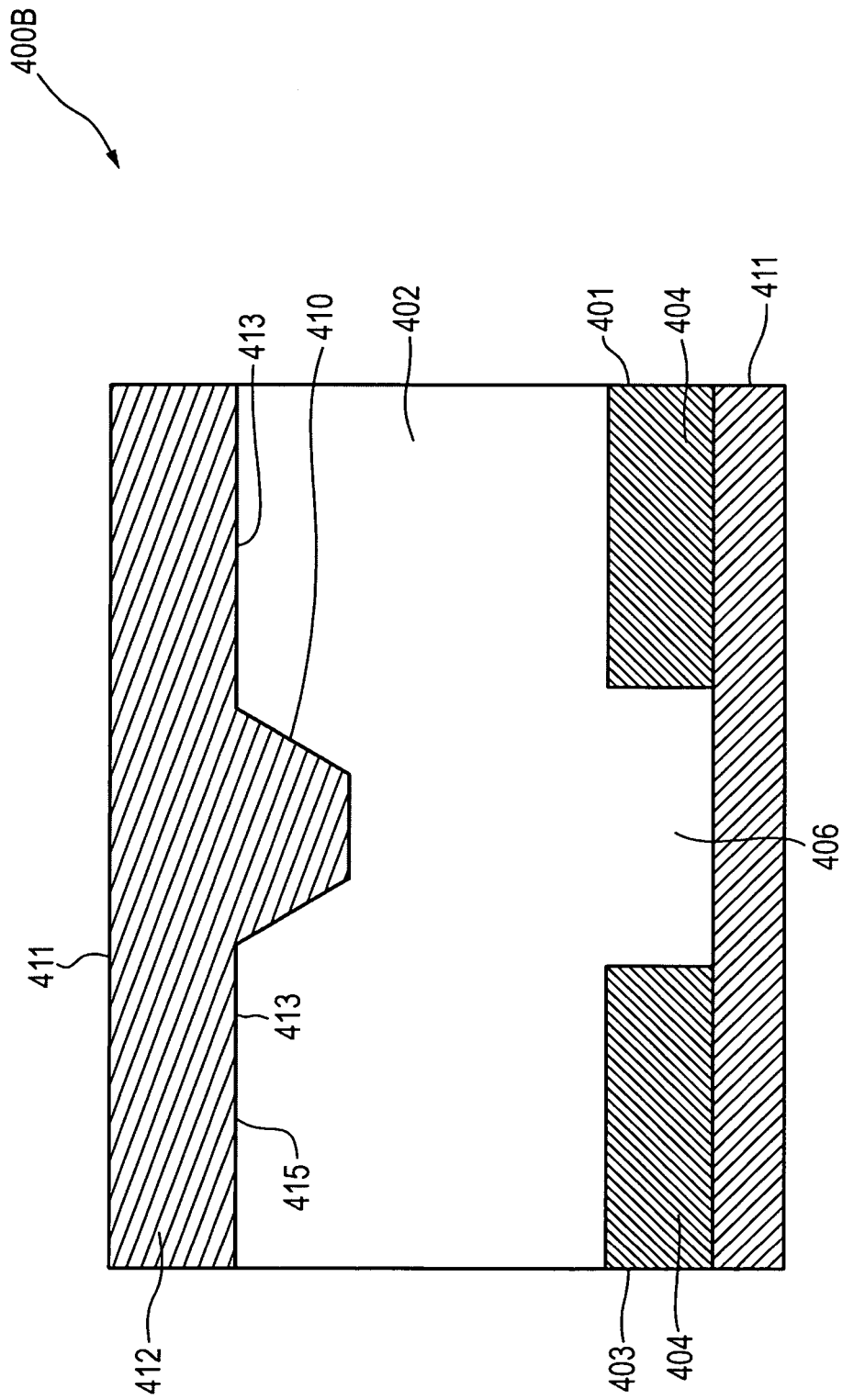

In FIG. 4b, stack 400B additionally includes a hard mask layer 412 that is deposited on layer 402. In a preferred configuration of this invention, hard mask layer 412 is an amorphous carbon layer. Preferably, layer 412 comprises a substantial fraction of diamondlike carbon, wherein the density of layer 412 is in a range of about 2 to 3.3 gm/cc. Preferably layer 410 is not substantially conformal, such that top surface 411 has substantially less height variation as compared to lower surface 413, which includes flat regions 415 and trench 410. Accordingly, the thickness of layer 412 is locally greater in the region above trench 410. As mentioned above, layer 412 acts as a hard mask that can be used to pattern small features in underlying layers. However, due to its opacity, layer 412 can obscure alignment mark portion 401, such that alignment cannot be performed using the latter feature.

In FIG. 4c, a dose of radiation 418 is introduced towards substrate 411 in the region of alignment mark portion 401. The dose of radiation is preferably visible wavelength or UV radiation that is sufficient to substantially graphitize hard mask layer 412, producing graphitized hard mask layer. The term "substantially graphitize", as used herein, refers to a process in which the degree of sp3 carbon bonding is substantially reduced, and the degree of sp2 carbon bonding is increased, resulting in a more graphitic microstructure of the amorphous carbon layer 414. However, layer 414 need not contain crystalline graphite, and can retain substantial hydrogen. Typically, density of a substantially graphitized amorphous carbon is substantially lower than one having a high fraction of diamondlike carbon. For example, crystalline graphite has a density of about 2.2 g/cm3, while that of crystalline diamond is about 3.2. The density of amorphous carbon varies, but typically can be in the range of about 1.7-3.0, depending on the component of diamondlike carbon. Accordingly, transformation of amorphous carbon having some fraction of diamondlike carbon into graphite-like material having little or no diamondlike carbon, can in principle result in decreases in density on the order of up to 30% or so, equivalent to an increase in thickness of up to 30-90 nm for a 300 nm thick amorphous carbon film after graphitization. Thus irradiated regions of an amorphous carbon film of an initial 300 nm thickness can be selectively expanded by the irradiation by about 90 nm compared to unirradiated portions.

It has been observed that KrF irradiation at 100 mJ/cm2 substantially graphitizes diamond-like carbon. For example, Seth et al. have observed a reduction in density from about 2.4 to about 1.7 g/cc when an amorphous carbon film is subjected to high fluence of 248 nm UV radiation (Seth, et al., Thin Solid Films 254 (1995) 92-95). Accordingly, the thickness of layer 414 can be substantially greater than that of layer 412. In addition, due to the greater local thickness of layer 412 in regions near trench 410, there is a differential increase in thickness of graphitized layer 414 over trench 410, such that mesa 416 forms.

In preferred configurations of this invention, the thickness of layer 412 ranges from about 50 to 1000 nm, and the height of mesa 416 ranges from about 20 to about 300 nm. It is to be noted that in the configuration of this invention depicted in FIG. 4c, both regions 417 and 416 receive radiation dose 418 and both increase in thickness with respect to unirradiated regions (not shown). However, because the initial thickness of layer 414 in region 410 is greater (see FIG. 4b), for example, by about 10-50%, the final thickness of layer 414 above trench 410 is greater and increases by a larger amount after irradiation as compared to the thickness in regions 417. Accordingly, layer 414 retains a substantial surface topography where the top surface of layer 414 is significantly elevated in regions 416 with respect to adjacent regions 415, where region 416 corresponds to the horizontal position of trench 406 in lower alignment mark portion 401. This topography can be sufficient to be observable in an imaging device or tool, due to, for example, the difference in reflection of light at different heights on the surface of layer 414. In this manner, layer 414 operates to preserve, or resurrect, the lower alignment mark portion 401. The horizontal location P of lower alignment mark 401 is preserved in upper alignment mark portion 421, by providing an imageable feature 416 whose location P corresponds to the horizontal position P of the buried alignment mark trench 406, which may be partly or totally obscured due to the opacity of layer 414. Thus, stack 400C can be considered to contain a lower alignment mark (or lower alignment mark region) 401 and an upper alignment mark 421 (or upper alignment mark region), where the position of the upper alignment mark is substantially the same as the lower alignment mark.

FIGS. 4d and 4e illustrate a cross sectional and plan view, respectively, of an alignment mark 422 that includes a plurality of regions 421. As illustrated in FIG. 4e, the border between region 414 and unirradiated region 412 may be viewable in an imaging tool. FIG. 4d indicates that region 414 can be formed by providing a dose of radiation through mask 420. In this manner, all of region 414 becomes elevated with respect to unirradiated region 412. Additionally, mesas 414 may reflect light differently than other portions of region 414, such that the position, shape, and size of mesas 416 are clearly discernible. Thus, mark 422 substantially replicates the positional feature information in lower alignment mark 424. Because the position of elevated features of mark 422 are aligned to respective trench features in lower alignment mark 424 without the aid of a mask, the process depicted in FIGS. 4a-f is a self-aligned process for preserving alignment mark information.

Although layer 412 in FIG. 4b is illustrated as having a completely flat upper surface, in other embodiments of this invention, layer 412 can have some degree of conformality, wherein a small trench forms above trench 410. To the extent that the thickness of layer 412 is substantially larger over trench region 410 than in regions over surfaces 413, a mesa region 416 can still be formed after graphitization of layer 412.

In one embodiment of this invention, a method for preserving an alignment mark in a substrate that is provided with a lower alignment mark structure having a trench feature, is characterized by: applying a hard mask coating to the substrate; and exposing portions of the substrate containing the lower alignment mark structure to a dose of radiation, wherein a top surface region of the hard mask exposed to the dose of radiation and located above the trench feature in the lower alignment mark structure is elevated with respect to the top surface adjacent regions of the hard mask coating.

In one embodiment of this invention, a method for resurrection of an alignment mark feature in a substrate having a defined trench region in a lower alignment mark is characterized by: depositing a coating layer over the lower alignment mark; providing a hard mask layer on a top surface of the coating layer; and exposing portions of the hard mask layer to a dose of radiation, wherein portions of the hard mask layer located above the trench region become elevated with respect to adjacent portions of the hard mask layer.

In one configuration of the present invention, a self-aligned alignment mark structure having a lower alignment mark that includes a lower trench region formed between mesa regions and having a coating layer disposed on the lower trench and mesa regions, is characterized in that the coating layer is configured to provide on its upper surface an upper trench region whose horizontal position corresponds to that of the lower trench region, wherein an upper trench region includes an elevated portion whose horizontal position substantially corresponds to the horizontal position of the lower alignment mark trench region.

While the preferred forms of the invention have been disclosed, it will be apparent to those skilled in the art that various changes and modifications may be made that will achieve some of the advantages of the invention without departing from the spirit and scope of the invention. It will be apparent to those reasonably skilled in the art that other components performing the same function may be suitably substituted. Further, the methods of the invention may be achieved in either all software implementations, using the appropriate processor instructions, or in hybrid implementations that utilize a combination of hardware logic and software logic to achieve the same results. Therefore, the scope of the invention is to be determined solely by the appended claims.

We claim:

1. A method for preserving an alignment mark, comprising;
   preparing a lower alignment mark structure above a substrate, said lower alignment mark structure defining a lower trench region;
   applying a hard mask coating above the substrate, said hard mask coating having a top surface;
   exposing portions of the hard mask coating to a dose of radiation so as to elevate a top surface region of the hard mask coating located above the lower trench region in the lower alignment mark structure, such that said top surface region is higher than portions of the top surface adjacent to the top surface region of the hard mask coating.

2. The method of claim 1, wherein the hard mask coating is amorphous carbon.

3. The method of claim 2, wherein the exposed portions of the hard mask layer are substantially graphitized.

4. The method of claim 2, further comprising depositing a coating layer on the lower alignment mark structure before applying the hard mask coating.

5. The method of claim 4, wherein the coating layer retains an upper trench region located above the trench region of the lower alignment mark.

6. The method of claim 5, wherein the hard mask layer is substantially planarizing, wherein a thickness of the hard mask layer above the upper trench region is greater than in adjacent regions before exposure of the hard mask to the dose of radiation.

7. The method of claim 2, wherein a thickness of the hard mask coating is about 50 to 1000 nm.

8. The method of claim 1, wherein the coating layer is a conformal coating.

9. A process for self-aligned resurrection of an alignment mark feature, comprising:
   defining a lower trench region in a lower alignment mark that is disposed on a substrate;
   depositing a coating layer over the lower alignment mark;
   providing a hard mask layer on a top surface of the coating layer; and
   exposing portions of the hard mask layer to a dose of radiation, wherein portions of the hard mask layer located above the trench region become elevated with respect to adjacent portions of the hard mask layer.

10. The method of claim 9, wherein the hard mask coating is amorphous carbon.

11. The method of claim 10, wherein a thickness of the exposed portions of the amorphous carbon is about 10 to 30 percent greater than a thickness of unexposed portions of the amorphous carbon.

12. The method of claim 10, wherein the coating layer includes an upper trench region located above the lower trench region of the lower alignment mark.

13. The method of claim 12, wherein a hard mask layer height in regions located above the upper trench region is about 10 to 100 nm greater than a hard mask layer height in adjacent regions.

14. The method of claim 9, wherein the hard mask layer is substantially planarizing, wherein a thickness of the hard mask layer above the upper trench region is about 10 to 50 percent greater than in adjacent regions before exposure of the hard mask to the dose of radiation.

15. The method of claim 9, wherein a thickness of the hard mask coating is about 50 to 1000 nm.

16. The method of claim 9, wherein the defining the lower trench region comprises;
   providing a substrate layer;
   depositing an additional layer on the substrate layer; and
   etching a selected portion of the additional layer.

17. A self-aligned alignment mark structure, comprising:
   a lower alignment mark structure disposed on a substrate and including a lower trench region and mesa regions;
   a coating layer disposed on the lower trench region and mesa regions, and including an upper trench region; and
   an upper alignment mark structure that includes an elevated portion whose horizontal position corresponds to that of the lower trench region, the elevated portion formed by selective expansion of a portion of a hard mask layer.

18. The self-aligned alignment mark structure of claim 17, wherein the hard mask layer is amorphous carbon.

19. The self-aligned alignment mark structure of claim 18, wherein a thickness of the hard mask layer is about 50 to 1000 nm.

20. The self-aligned alignment mark structure of claim 18, wherein the lower alignment mark structure comprises a plurality of lower trench and mesa regions, and wherein the upper alignment mark structure comprises a plurality of elevated portions that correspond to respective lower trench regions.

21. The self-aligned alignment marks structure of claim 20, wherein the hard mask layer is substantially planarizing, wherein a thickness of the hard mask layer above the upper trench region is about 10 to 50 percent greater than in adjacent regions before exposure of the hard mask to the dose of radiation.

22. The self-aligned alignment mark structure of claim 20, wherein the plurality of elevated portions are imageable in an alignment tool.

23. A method for restoring an alignment mark, comprising:
   providing a substrate layer;
   providing a mesa layer on top of the substrate layer;
   etching a selected portion of the mesa layer to define a lower alignment mark having a lower trench region;
   depositing a coating layer above the lower alignment mark, the coating layer being substantially conformal, wherein an upper trench region is formed in an upper portion of the coating layer above the lower trench region;
   depositing an amorphous carbon layer on the coating layer; and
   exposing portions of the amorphous carbon layer to a dose of radiation so as to elevate a top surface region of the amorphous carbon layer located above the lower trench region in the lower alignment mark, such that said top surface region is higher than adjacent portions of the top surface of the amorphous carbon layer, wherein said top surface region comprises an upper alignment mark located at a same horizontal position as the lower alignment mark.

* * * * *